(12) United States Patent
Lai

(10) Patent No.: US 7,002,206 B2
(45) Date of Patent: Feb. 21, 2006

(54) MULTI-BIT MEMORY UNIT AND FABRICATION METHOD THEREOF

(75) Inventor: Erh-Kun Lai, Taichung (TW)

(73) Assignee: Macronix International Co., Ltd., Hsin-Chu (TW)

(*) Notice: Subject to any disclaimer, the term of this patent is extended or adjusted under 35 U.S.C. 154(b) by 0 days.

(21) Appl. No.: 10/939,385

(22) Filed: Sep. 14, 2004

(65) Prior Publication Data

US 2005/0035388 A1  Feb. 17, 2005

Related U.S. Application Data

(63) Continuation of application No. 10/357,427, filed on Feb. 4, 2003, now Pat. No. 6,858,495.

(30) Foreign Application Priority Data

Jun. 24, 2002 (TW) .............................. 91113773 A

(51) Int. Cl.
*H01L 21/8222* (2006.01)
(52) U.S. Cl. .................... 257/330; 257/331; 257/332; 257/334

(58) Field of Classification Search ................ 257/330, 257/331, 332, 334; 438/259, 270, 272
See application file for complete search history.

(56) References Cited

U.S. PATENT DOCUMENTS

| 5,616,510 A | 4/1997 | Wong |
| 5,693,552 A | 12/1997 | Hsu |
| 5,945,705 A * | 8/1999 | Liu et al. ..................... 257/315 |
| 6,011,725 A | 1/2000 | Eitan |
| 6,043,122 A | 3/2000 | Liu et al. |

* cited by examiner

*Primary Examiner*—Amir Zarabian
*Assistant Examiner*—Christy Novacek
(74) *Attorney, Agent, or Firm*—Birch, Stewart, Kolasch & Birch, LLP

(57) ABSTRACT

A multi-bit memory unit and fabrication method thereof. A semiconductor substrate forming a protruding semiconductor substrate is provided, an ion implantation region is formed on the semiconductor substrate beside the protruding semiconductor substrate, a spacer is formed on a sidewall of the protruding semiconductor substrate, a doped region is formed on the semiconductor substrate, and an ONO layer is conformally formed on the surface of the protruding semiconductor substrate, the spacer, the doped region, and the semiconductor substrate.

13 Claims, 9 Drawing Sheets

MULTI-BIT MEMORY UNIT AND FABRICATION METHOD THEREOF

CROSS REFERENCE TO RELATED APPLICATIONS

The present application is a continuation application of U.S. application Ser. No. 10/357,427, filed on Feb. 4, 2003, now U.S. Pat. No. 6,858,495.

BACKGROUND OF THE INVENTION

1. Field of the Invention

The invention relates to a structure of memory unit and, more particularly, to a memory with multi-bits and fabrication method thereof.

2. Description of the Related Art

Memory devices for nonvolatile storage of information are currently in widespread use, in a myriad of applications. A few examples of nonvolatile semiconductor memory include read only memory (ROM), programmable read only memory (PROM), erasable programmable read only memory (EPROM), electrically erasable programmable read only memory (EEPROM) and flash EEPROM.

In many circuit designs it is desirable to have a nonvolatile memory device that can be erased and reprogrammed in-circuit without the need to remove the device.

High-density nonvolatile memory devices have been receiving much attention for application in many fields. One of the most important factors is the low cost of the reduced size of each memory cell.

Only one set of data is programmed to or erased from the flash memory at a time.

In FIG. 1a, high voltage is applied to a control gate 105, and electrons enter a floating gate 103 from a source 101a in the silicon substrate 101 through the gate oxide layer 102. Thus, the flash memory is programmed.

In FIG. 1b, low voltage or no voltage is applied to the control gate 105 and high voltage is applied to the drain 101b in the silicon substrate 101, thus electrons return to the source 101a from the floating gate 103 through the gate oxide layer 102. Thus, the flash memory is erased.

Eitan discloses a two-bits non-volatile electrically erasable and programmable semiconductor memory cell in U.S. Pat. No. 6,011,725, in which two sets of data are stored in the non-volatile electrically erasable and programmable semiconductor memory cell.

SUMMARY OF THE INVENTION

The present invention is directed to a multi-bit memory unit and fabrication method thereof to increase the storage capacity thereof.

Accordingly, the present invention provides a method for fabricating a multi-bit memory unit, in which, first, a semiconductor substrate forming a hard mask layer is provided. Ions are implanted into the semiconductor substrate to form an ion implantation region using the hard mask layer as a mask. A first spacer is formed on a sidewall of the hard mask layer. The semiconductor substrate is anisotropically etched to form a protruding semiconductor substrate using the hard mask layer and the first spacer as masks. A second spacer is formed on a sidewall of the protruding semiconductor substrate and the first spacer. The semiconductor substrate is anisotropically etched to form an opening using the hard mask layer and the second spacer as masks, and then the second spacer is removed. A doped layer is conformally formed on the semiconductor substrate. The doped layer is anisotropically etched to form a third spacer on a sidewall of the protruding semiconductor substrate. The opening is filled with the doped layer. After the hard mask layer and the first spacer are removed, an ONO layer is conformally formed on the semiconductor substrate.

Accordingly, the present invention provides a method for fabricating a multi-bit memory unit, in which, first, a semiconductor substrate forming a hard mask layer is provided. Ions are implanted into the semiconductor substrate to form an ion implantation region using the hard mask layer as a mask. A first insulation layer is conformally formed on the surface of the semiconductor substrate and the hard mask layer. The first insulation is anisotropically etched to form a first spacer on a sidewall of the hard mask layer. The semiconductor substrate is anisotropically etched to form a protruding semiconductor substrate using the hard mask layer and the first spacer as masks. A second insulation layer is conformally formed on a surface of the semiconductor substrate forming the hard mask layer, the first spacer, and the protruding semiconductor substrate. The second insulation layer is anisotropically etched to form a second spacer on a sidewall of the protruding semiconductor substrate and the first spacer. The semiconductor substrate is anisotropically etched to form an opening on the semiconductor substrate using the hard mask layer and the second spacer as masks, and then the second spacer is removed. A doped layer is conformally formed on the semiconductor substrate. The doped layer is anisotropically etched to form a third spacer on a sidewall of the protruding semiconductor substrate. The opening is filled with the doped layer. After the hard mask layer and the first spacer are removed, an ONO layer is conformally formed on the semiconductor substrate.

Accordingly, the present invention provides a multi-bit memory unit comprising a semiconductor substrate, a protruding semiconductor substrate formed on the semiconductor substrate, an ion implantation region formed on a top corner of the protruding semiconductor substrate, a spacer formed on a sidewall of the protruding semiconductor substrate, a doped region formed on the semiconductor substrate beside the spacer, and an ONO layer conformally formed on the surface of the semiconductor substrate forming the protruding semiconductor substrate, the spacer, and the doped region.

BRIEF DESCRIPTION OF THE DRAWINGS

For a better understanding of the present inventions, reference is made to detailed descriptions to be read in conjunctions with the accompanying drawings, in which.

DETAILED DESCRIPTION OF THE INVENTION

Figure 1A:
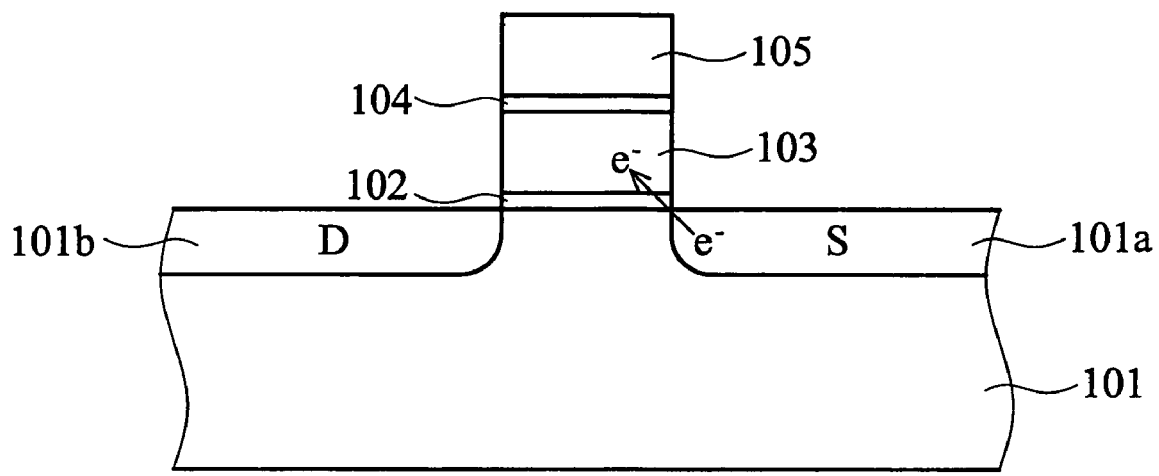
FIG. 1a is a cross-section of the conventional method of programming a flash memory.
Figure 1B:
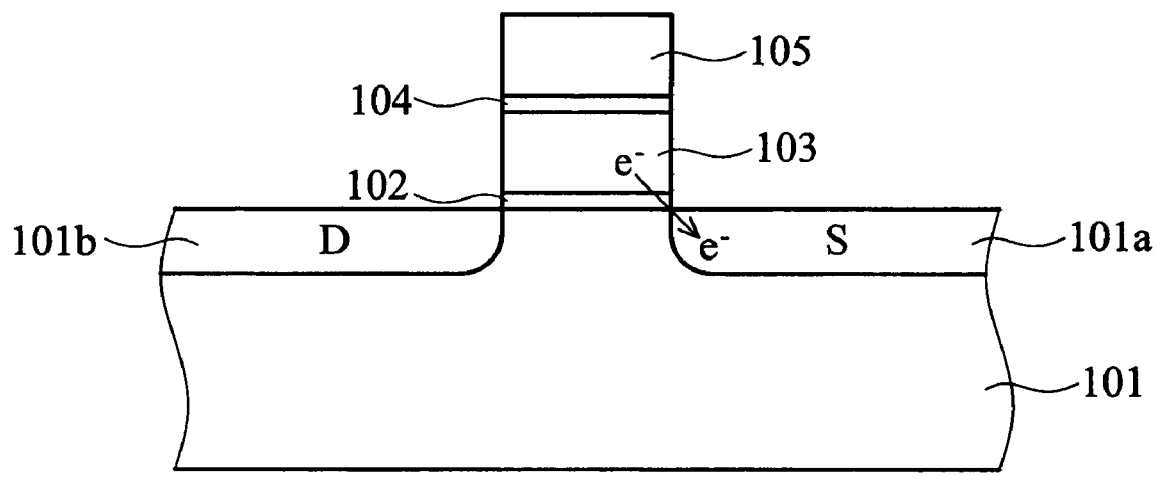
FIG. 1b is a cross-section of the conventional method of erasing a flash memory.
Figure 2A:
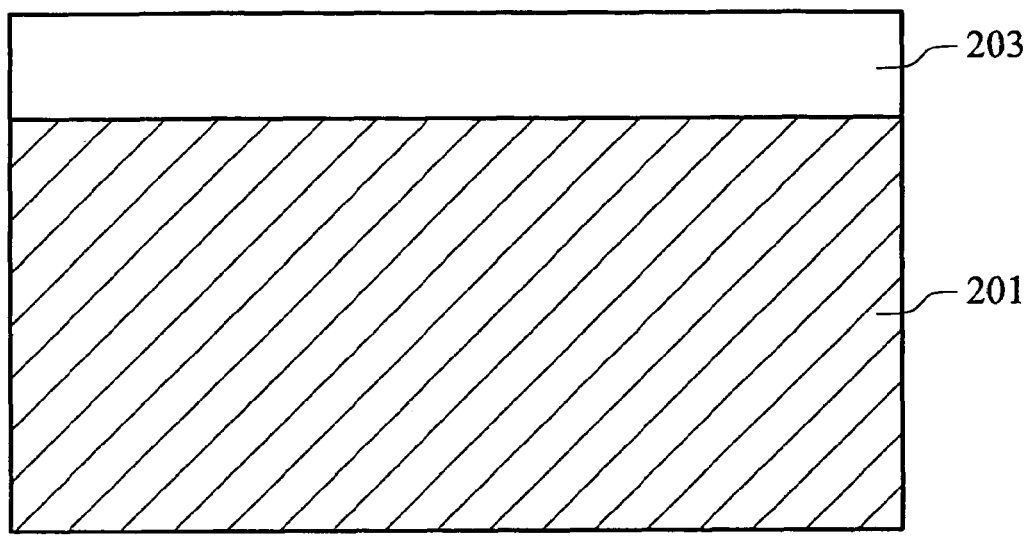
FIGS. 2a–2n are cross-sections of the multi-bit memory unit of the present invention.
Figure 2B:
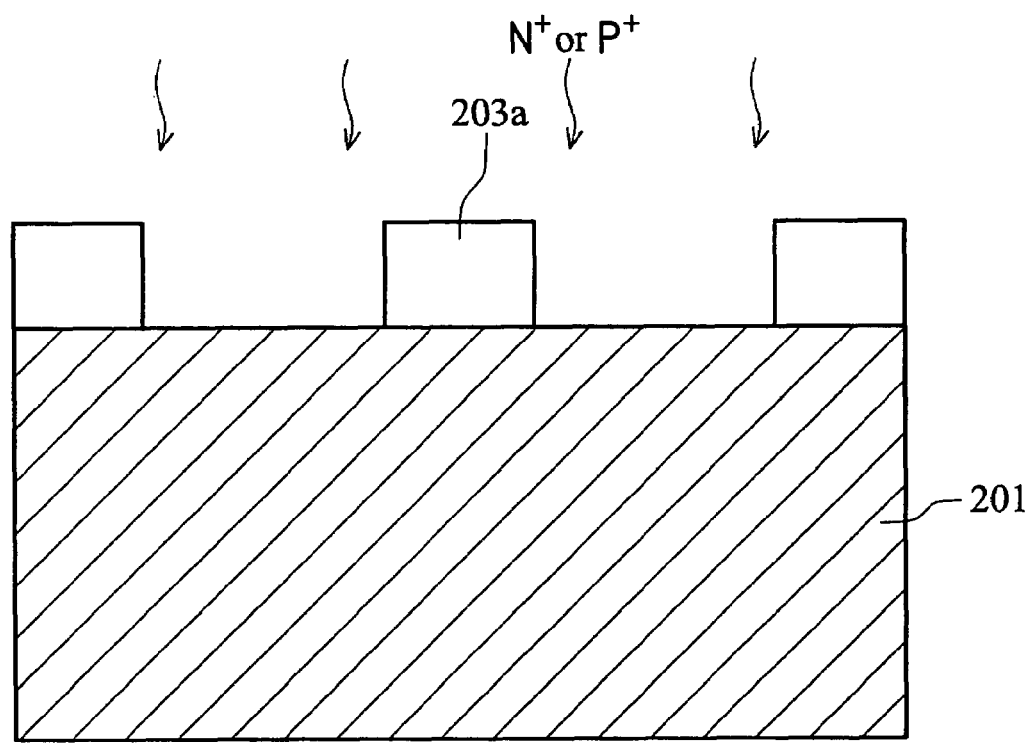
Figure 2C:
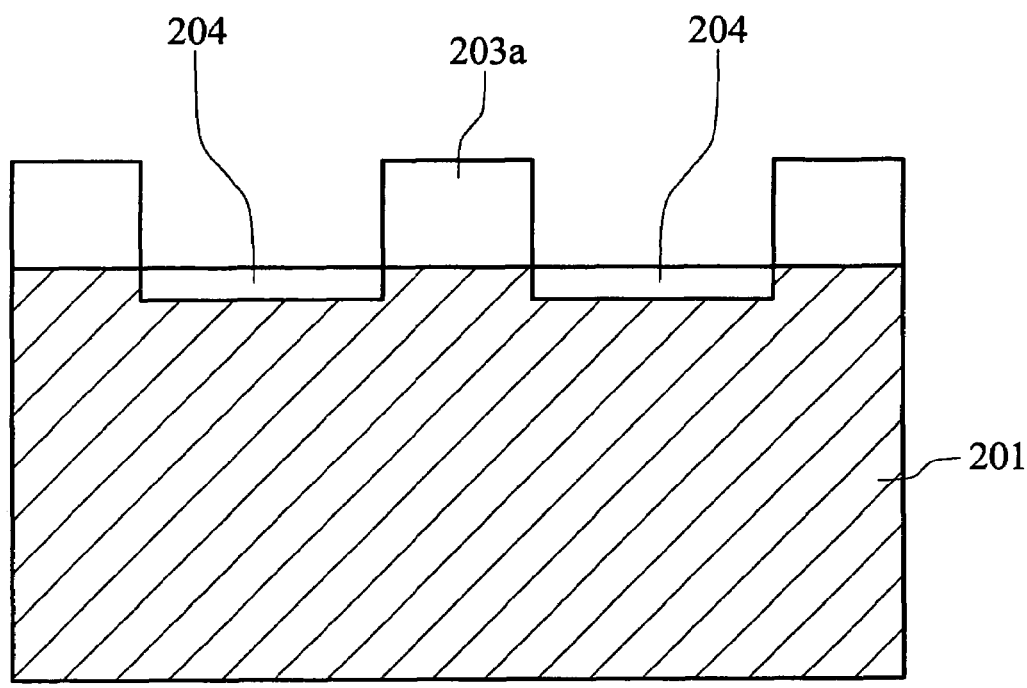
Figure 2D:
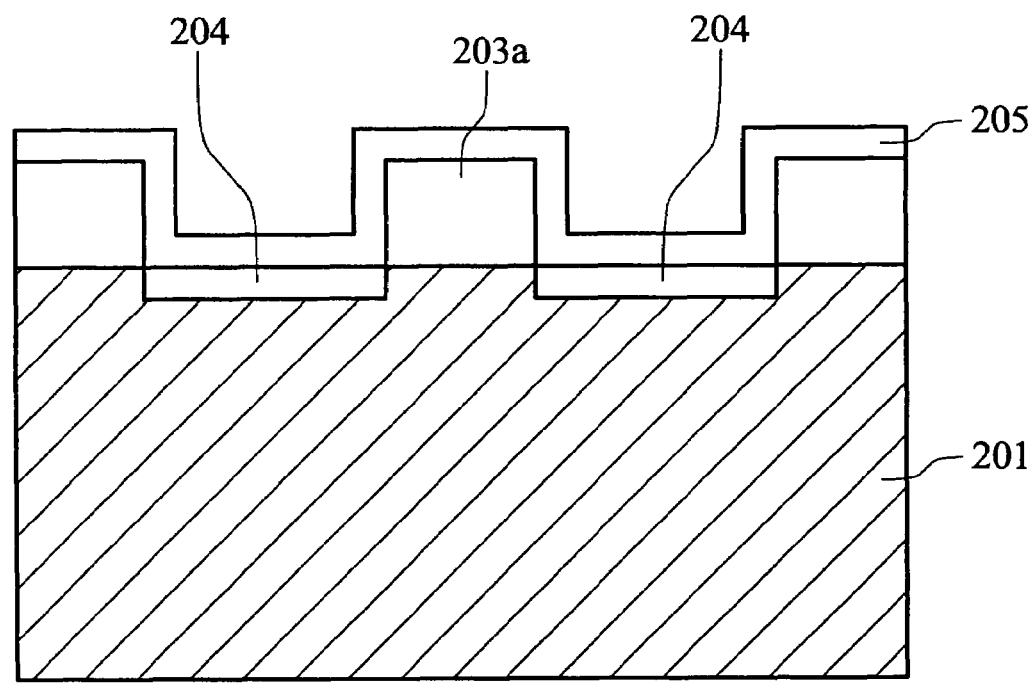
Figure 2E:
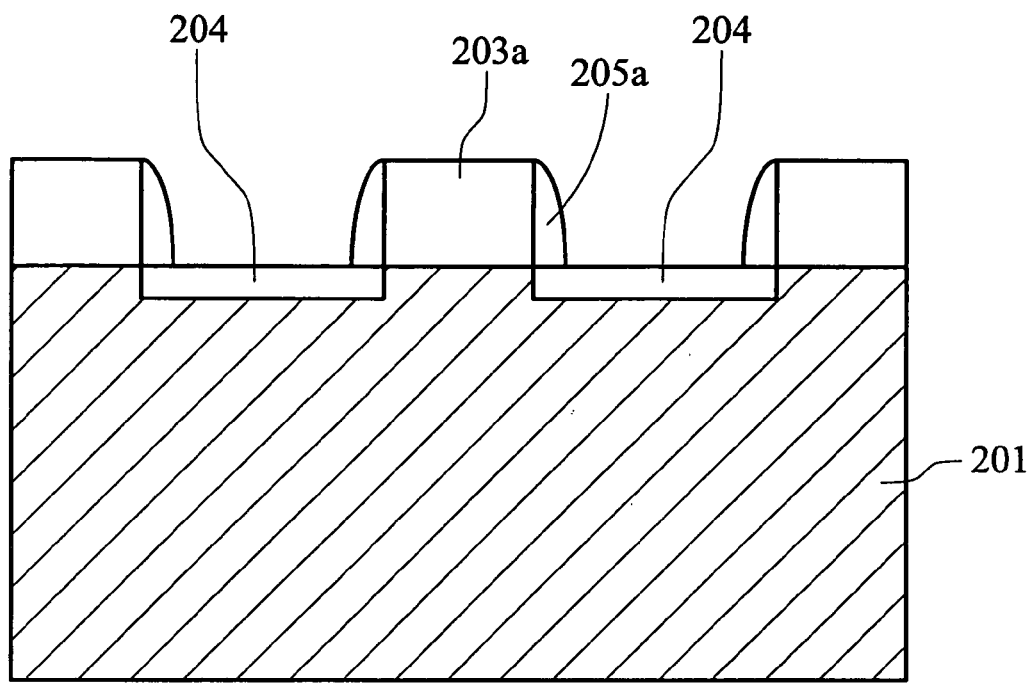
Figure 2F:
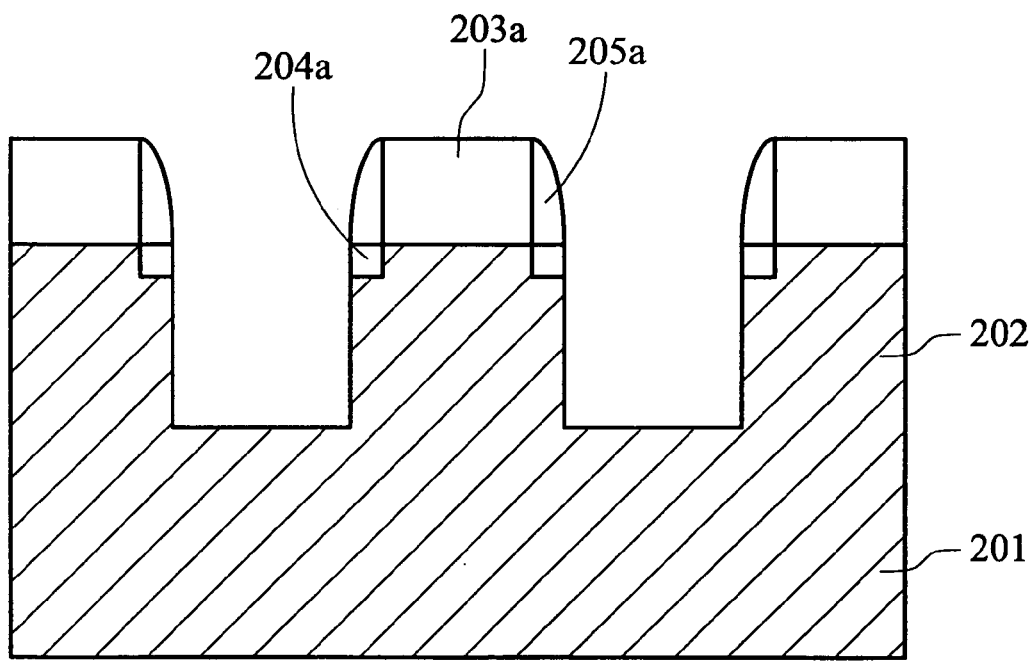
Figure 2G:
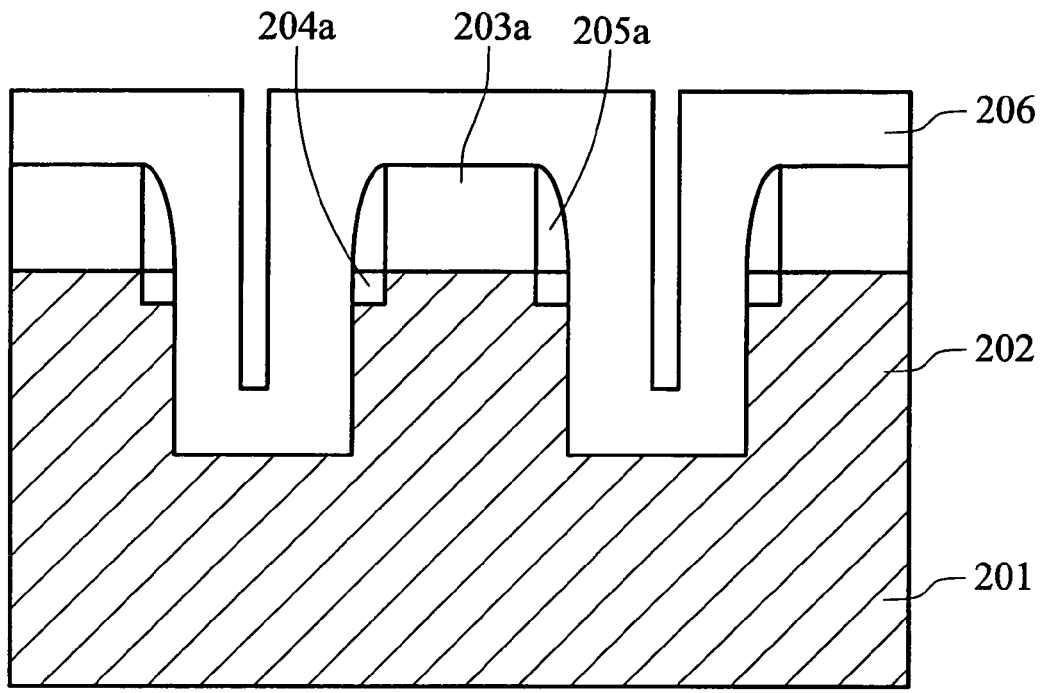
Figure 2H:
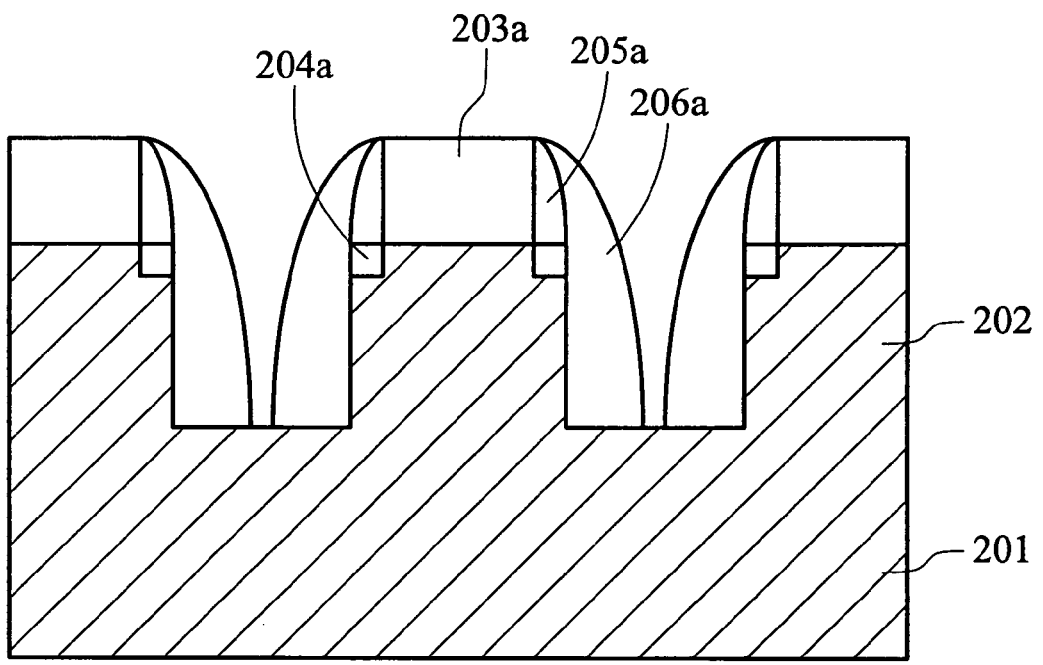
Figure 2I:
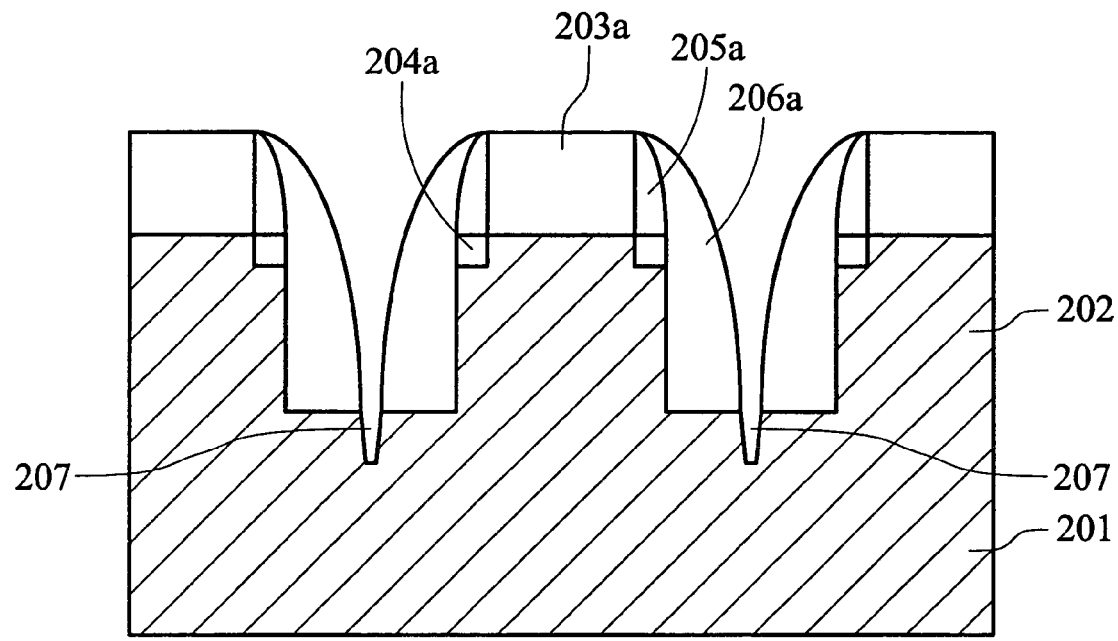
Figure 2J:
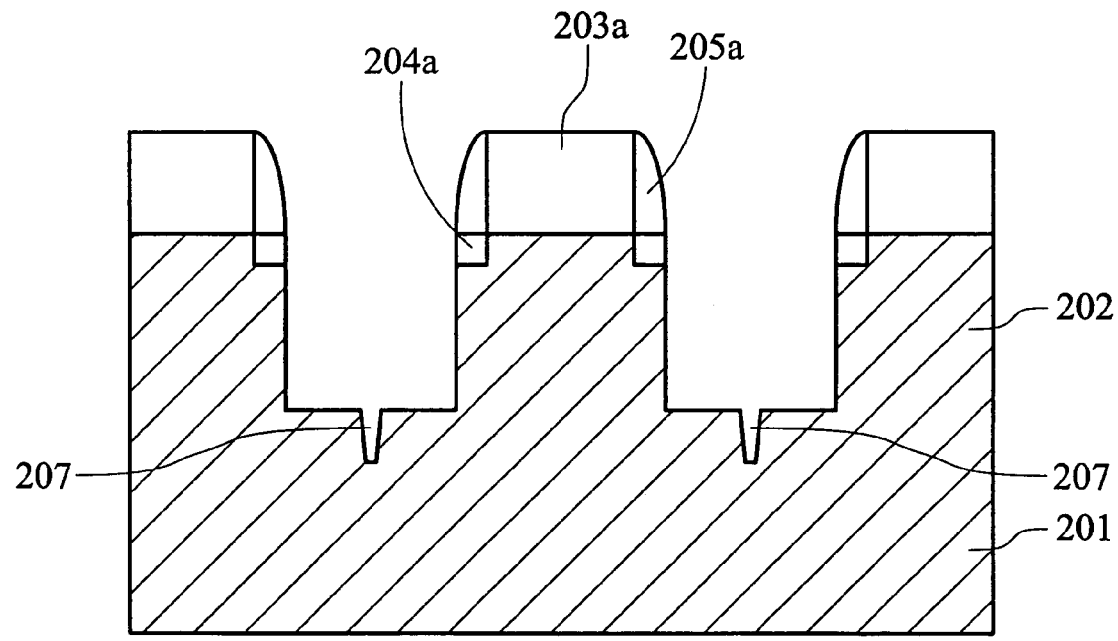
Figure 2K:
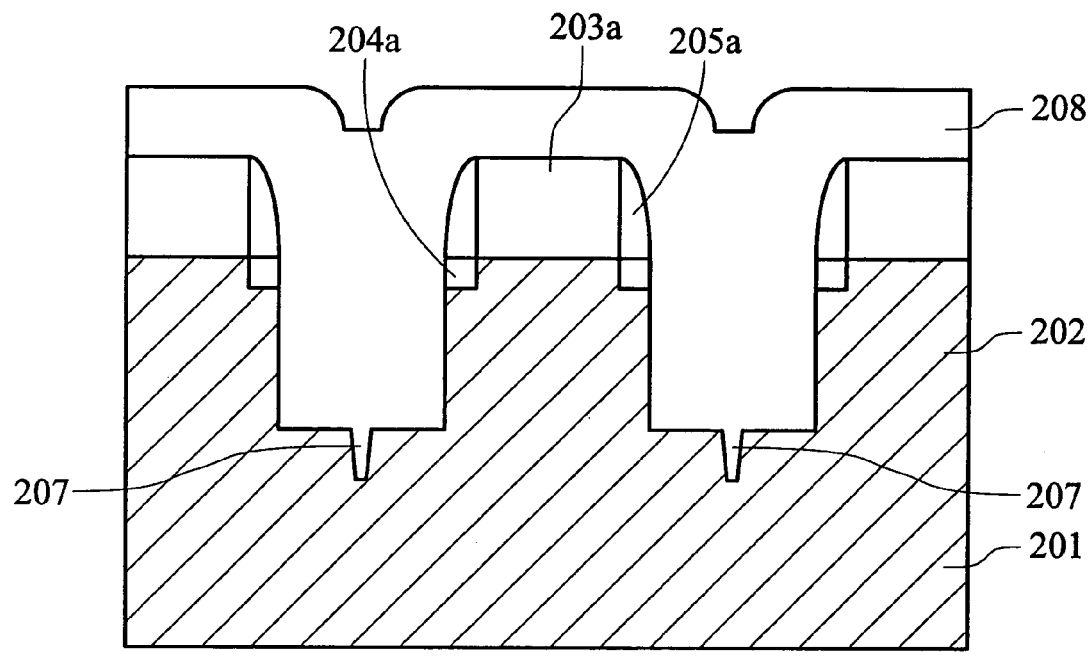
Figure 2L:
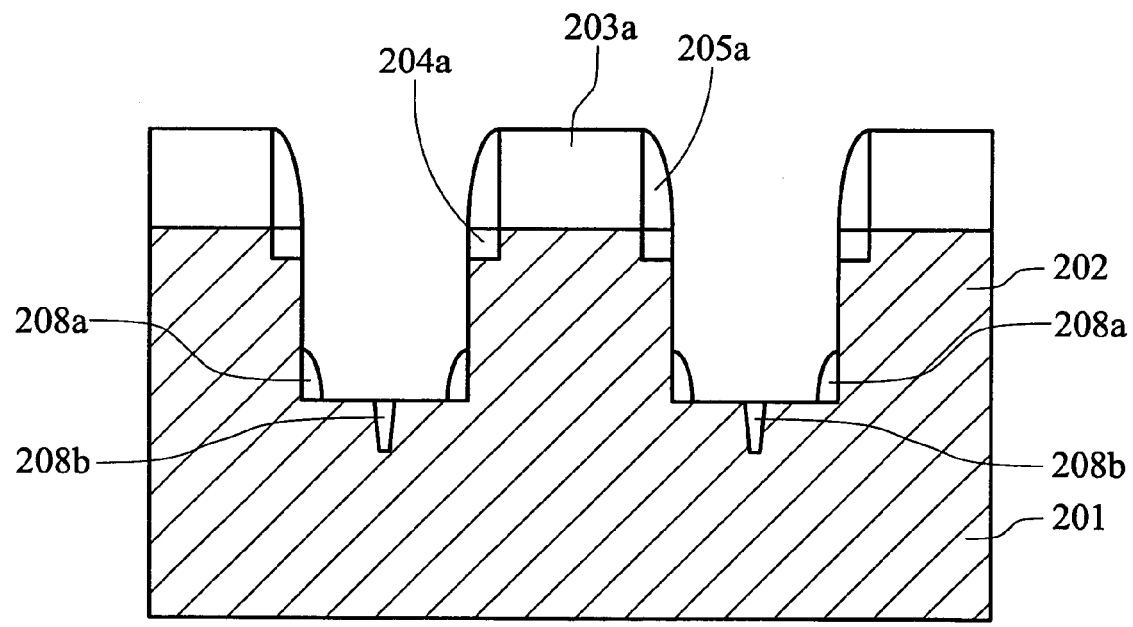
Figure 2M:
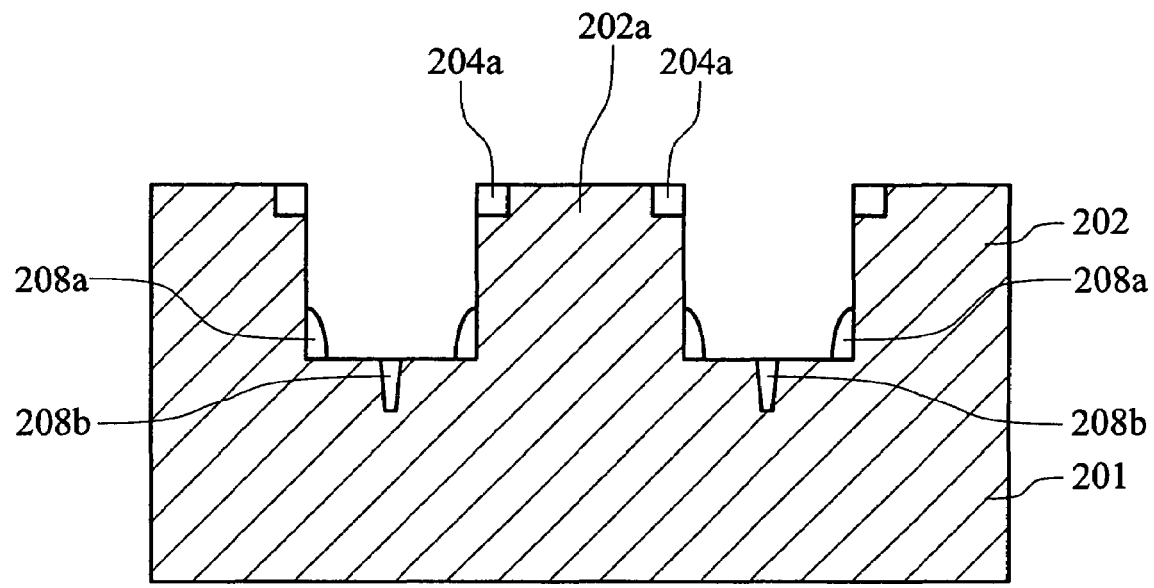
Figure 2N:
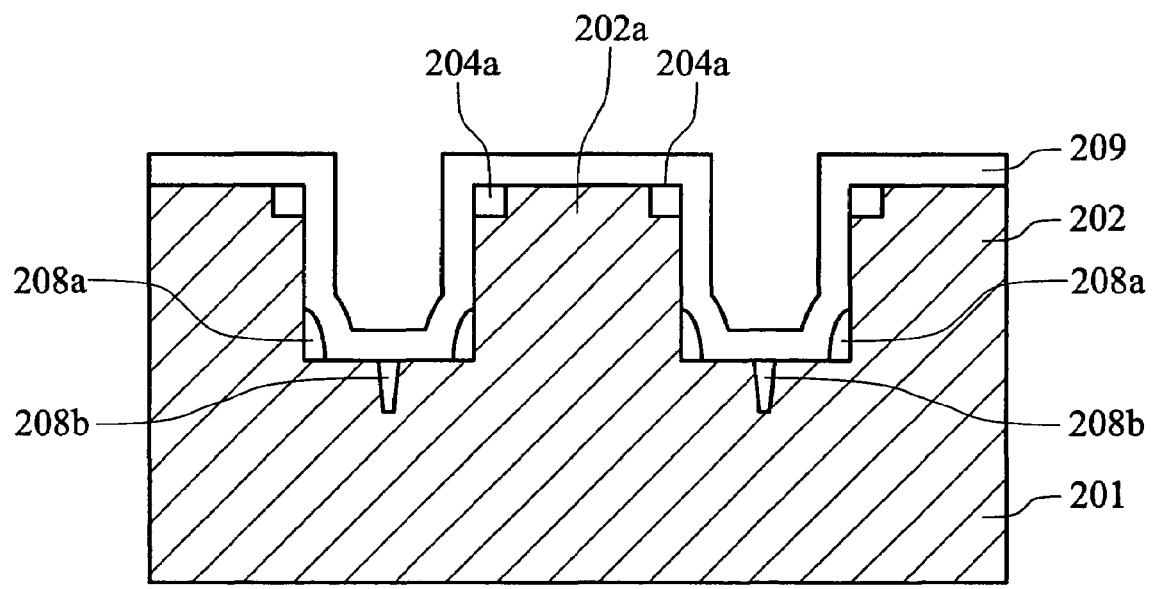

FIGS. 2a–2n are cross-sections of the multi-bit memory unit of the present invention.

In FIG. 2a, a semiconductor substrate 201, such as polysilicon or epitaxial silicon, is provided, and source/drain areas (not shown) are formed thereon. A hard mask layer 203 is formed on the semiconductor substrate 201. The semiconductor substrate 201 is a P-type polysilicon or P-type epitaxial silicon when B ions are implanted into the semiconductor substrate 201. The semiconductor substrate 201 is an N-type polysilicon or N-type epitaxial silicon when As ions or P ions are implanted into the semiconductor substrate 201.

In FIG. 2b, the hard mask layer 203 is photolithographed and etched sequentially to form a hard mask layer 203a. The hard mask layer 203a has an opening, and a portion of the surface of the semiconductor substrate 201 is exposed via the opening. Ions are implanted into the semiconductor substrate 201 to form an ion implantation region 204 using the hard mask layer 203a as a mask, and the ion implantation region 204 is shown as FIG. 2c. The ion implantation region 204 is an N-type, such as As or P, ion implantation region when the semiconductor substrate 201 is a P-type polysilicon or P-type epitaxial silicon. The ion implantation region 204 is a P-type, such as B, ion implantation region when the semiconductor substrate 201 is an N-type polysilicon or N-type epitaxial silicon.

In FIG. 2d, a first insulation layer 205 is conformally formed on the surface of the semiconductor substrate 201 forming the ion implantation region 204 and the hard mask layer 203a.

In FIG. 2e, the insulation layer 205 is anisotropically etched to form a first spacer 205a on the sidewall of the hard mask layer 203a.

In FIG. 2f, the semiconductor substrate 201 is anisotropically etched to a predetermine depth to form a protruding semiconductor substrate 202 using the hard mask layer 203a and the first spacer 205a as masks. An ion implantation region 204a is formed on a top corner of the protruding semiconductor substrate 202.

In FIG. 2g, a second insulation layer 206 is conformally formed on the surface of the semiconductor substrate 201, the protruding semiconductor substrate 202, the hard mask layer 203a, the ion implantation region 204a, and the first spacer 205a. The material of the second insulation layer 206 is different from the first insulation layer 205, and the etching rate of the second insulation layer 206 is larger than the first insulation layer 205.

In FIG. 2h, the second insulation layer is an isotropically etched to form a second spacer 206a on a sidewall of the first spacer 205a and the protruding semiconductor substrate 202.

In FIG. 2i, the semiconductor substrate 201 is anisotropically etched to form an opening 207 on the semiconductor substrate 201 using the hard mask layer 203a and the second spacer 206a as masks.

In FIG. 2j, the second spacer 206a is removed.

In FIG. 2k, a doped layer 208 is conformally formed on the surface of the semiconductor substrate 201, the protruding semiconductor substrate 202, the hard mask layer 203a, the ion implantation region 204a, the first spacer 205a, and the opening 207. The doped layer 208 covers over the surface of the semiconductor substrate 201 and elements thereon. The opening 207 is filled with the doped layer 208.

The doped layer is an N-type, such as As or P, ion implantation region when the semiconductor substrate 201 is P-type polysilicon or P-type epitaxial silicon. The doped layer 208 is a P-type, such as B, ion implantation region when the semiconductor substrate 201 is N-type polysilicon or N-type epitaxial silicon.

In FIG. 2l, the doped layer 208 is anisotropically etched to form a third spacer on the sidewall of the protruding semiconductor substrate 202, and the doped layer 208 is filled with the opening 207 to form a doped layer 208b.

Dopants for the ion implantation region 204 and the doped layer 208 are not necessarily identical, but doping characteristics of ion implantation region 204 and doped layer 208 are the same. In other words, the ion implantation region 204 and the doped layer 208 are N-type, such as As or P, when the semiconductor substrate 201 is P-type, and the ion implantation region 204 and the doped layer 208 are P-type, such as B, when the semiconductor substrate 201 is N-type In FIG. 2m, the hard mask layer 203a and the first spacer 205a are removed.

In FIG. 2n, an ONO layer 209 is conformally formed on the surface of the semiconductor substrate 201, the doped layer 208b, the protruding semiconductor substrate 202, the ion implantation region 204a, and the third spacer 208a, and thus the multi-bit memory unit is formed.

Figure 3:
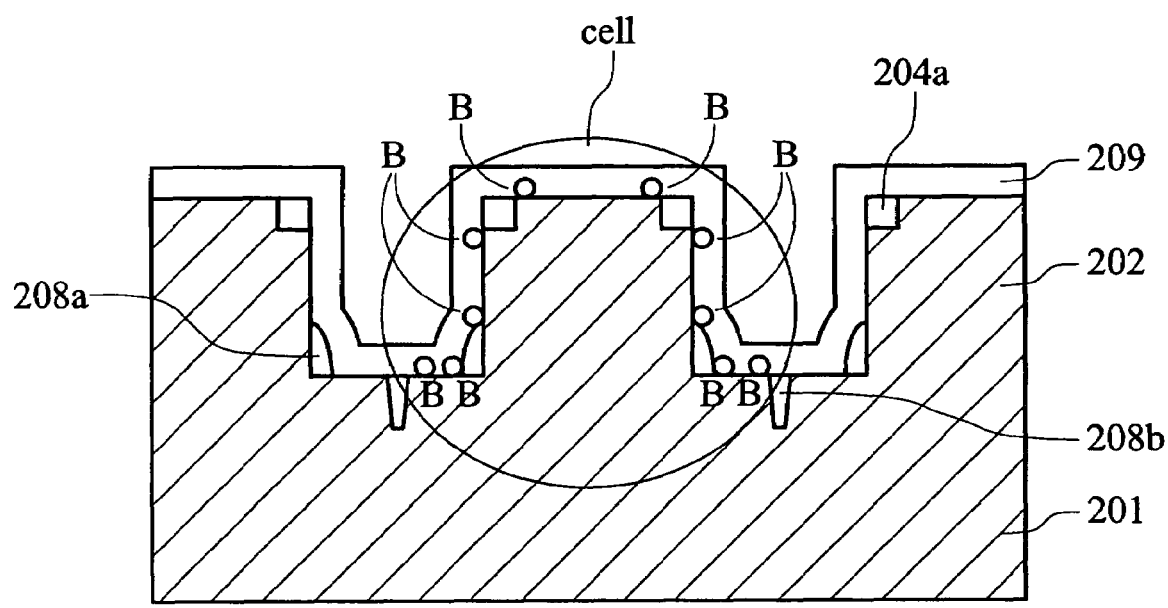
FIG. 3 is a cross-section of the structure of the multi-bit memory unit of the present invention.

FIG. 3 is a cross-section of the structure of the multi-bit memory unit of the present invention.

In FIG. 3, the multi-bit memory unit B is composed of the ONO layer 209, the semiconductor substrate 201, the protruding semiconductor substrate 202, the ion implantation region 204a, the third spacer 208a, and the doped region 208b. The characteristics of ion implantation region 204a, the third spacer 208a, and the doped 208b must be different from the semiconductor substrate 201 and the protruding semiconductor substrate 202. In this case, the multi-bit memory unit B provides 10 bits to store data.

According to the multi-bit memory unit and the fabrication method thereof in the present invention, the number of memory cells is increased by forming a pair of ion-doped areas in the semiconductor substrate, which exhibit different characteristics from the semiconductor substrate.

While the invention has been described by way of example and in terms of the preferred embodiments, it is to be understood that the inventions is not limited to the disclosed embodiments. To the contrary, it is intended to cover various modifications and similar arrangements (as would be apparent to those skilled in the art). Thus, the scope of the appended claims should be accorded the broadest interpretations so as to encompass all such modifications and similar arrangements.

What is claimed is:

1. A multi-bit memory unit, comprising:
   a semiconductor substrate of a first conductive type with a protruding part and a non-protruding part;
   two ion implantation regions of a second conductive type formed in two top corners of the protruding part;
   a spacer of the second conductive type formed on a lower portion of a sidewall of the protruding part;
   a doped region of the second conductive type embedded in the semiconductor substrate beside the spacer; and
   an ONO layer conformally formed on the surface of the protruding part, the spacer, the two doped regions, and the semiconductor substrate;
   wherein junctions between the semiconductor substrate of the first conductive type and the two ion implantation regions, the spacer, and the doped region of the second conductive type are formed as memory bits.

2. The multi-bit memory unit as claimed in claim 1, wherein the protruding semiconductor substrate is polysilicon or epitaxial silicon.

3. The multi-bit memory unit as claimed in claim 1, wherein the materials of the spacer and the doped region are the same.

4. The multi-bit memory unit as claimed in claim 1, wherein a lower level of the ion implantation region is higher than the upper level of the spacer.

5. The multi-bit memory unit as claimed in claim 1, wherein the doped region is beneath the non-protruding part.

6. The multi-bit memory unit as claimed in claim 1, wherein the protruding semiconductor substrate is P-type polysilicon or epitaxial silicon.

7. The multi-bit memory unit as claimed in claim 6, wherein the ion implantation region is an N-type ion implantation region.

8. The multi-bit memory unit as claimed in claim 6, wherein the spacer is an N-type doped layer.

9. The multi-bit memory unit as claimed in claim 6, wherein the doped region is an N-type doped region.

10. The multi-bit memory unit as claimed in claim 1, wherein the protruding semiconductor substrate is N-type polysilicon or epitaxial silicon.

11. The multi-bit memory unit as claimed in claim 10, wherein the ion implantation region is a P-type ion implantation region.

12. The multi-bit memory unit as claimed in claim 10, wherein the spacer is a P-type doped layer.

13. The multi-bit memory unit as claimed in claim 10, wherein the doped region is a P-type doped region.

* * * * *